(12) United States Patent
Oelkrug et al.

(10) Patent No.: US 8,758,537 B2
(45) Date of Patent: Jun. 24, 2014

(54) METHOD FOR PRODUCING A MULTIPLICITY OF SEMICONDUCTOR WAFERS BY PROCESSING A SINGLE CRYSTAL

(75) Inventors: Hans Oelkrug, Tittmoning (DE); Josef Schuster, Ostermiething (CH)

(73) Assignee: Siltronic AG, Munich (DE)

( * ) Notice: Subject to any disclaimer, the term of this patent is extended or adjusted under 35 U.S.C. 154(b) by 469 days.

(21) Appl. No.: 13/087,431

(22) Filed: Apr. 15, 2011

(65) Prior Publication Data
US 2011/0265940 A1    Nov. 3, 2011

(30) Foreign Application Priority Data

Apr. 28, 2010 (DE) .......................... 10 2010 018 570

(51) Int. Cl.
*B32B 37/00* (2006.01)

(52) U.S. Cl.
USPC .......................................... 156/153; 156/250

(58) Field of Classification Search
USPC ................................................. 156/153, 250
See application file for complete search history.

(56) References Cited

U.S. PATENT DOCUMENTS

| | | | |
|---|---|---|---|
| 5,529,051 A | | 6/1996 | Miller |
| 5,839,425 A * | | 11/1998 | Toyama et al. ............. 125/16.02 |
| 6,055,293 A * | | 4/2000 | Secrest ............................ 378/70 |
| 6,159,284 A | | 12/2000 | Oelkrug |
| 7,137,865 B2 | | 11/2006 | Hammer et al. |
| 7,311,101 B2 * | | 12/2007 | Nakashima ..................... 125/21 |
| 2001/0017130 A1 | | 8/2001 | Ohmori |
| 2004/0118338 A1 | | 6/2004 | Hammer |
| 2005/0229840 A1 | | 10/2005 | Iida |
| 2009/0304994 A1 | | 12/2009 | Daub |
| 2010/0089209 A1 * | | 4/2010 | Rieger et al. ...................... 83/14 |

FOREIGN PATENT DOCUMENTS

| | | |
|---|---|---|
| DE | 19526711 A1 | 2/1996 |
| DE | 19825051 A1 | 12/1999 |
| DE | 102008026784 A1 | 12/2009 |
| EP | 1498516 A1 | 1/2005 |
| JP | 10-337695 A * | 12/1998 |
| JP | 11-285955 A * | 10/1999 |
| JP | 2000323443 A2 | 11/2000 |
| JP | 2004066734 A | 3/2004 |
| JP | 2004512251 A | 4/2004 |
| JP | 2009186181 A | 8/2009 |

OTHER PUBLICATIONS

Machine Translation of Japanese Patent 10-337695, Date Unknown.*
Machine translation of Japanese Patent 11-285955,, 6 pages, date unknown.*

* cited by examiner

*Primary Examiner* — Jeff Aftergut
(74) *Attorney, Agent, or Firm* — Leydig, Voit & Mayer, Ltd.

(57) ABSTRACT

A method for producing a plurality of semiconductor wafers includes processing a single crystal. The single crystal is provided in a grown state and has a central longitudinal axis with an orientation that deviates from a sought orientation of a crystal lattice of the semiconductor wafers. A block is sliced from the single crystal along cutting planes perpendicular to a crystallographic axis corresponding to the sought orientation of the crystal lattice of the semiconductor wafers. A lateral surface of the block is ground around the crystallographic axis. A plurality of semiconductor wafers are then sliced from the ground block along cutting planes perpendicular to the crystallographic axis.

7 Claims, 4 Drawing Sheets

Fig. 5
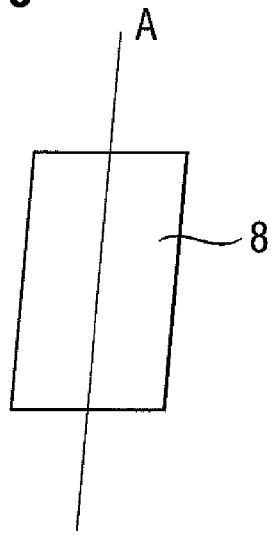
Fig. 7
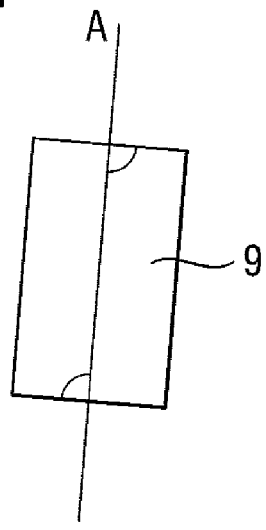
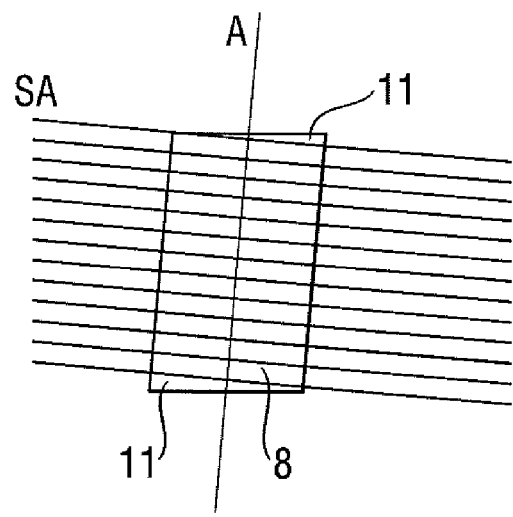
Fig. 9
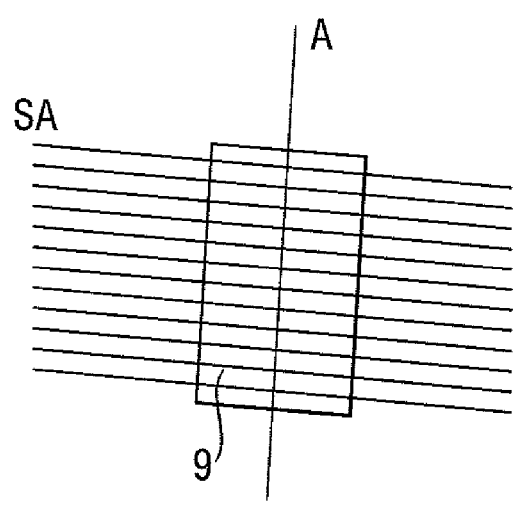
Fig. 10

METHOD FOR PRODUCING A MULTIPLICITY OF SEMICONDUCTOR WAFERS BY PROCESSING A SINGLE CRYSTAL

CROSS REFERENCE TO RELATED APPLICATIONS

This application claims priority to German Patent Application No. DE 10 2010 018 570.1, filed Apr. 28, 2010, which is incorporated by reference herein in its entirety.

FIELD

The invention relates to a method for producing a multiplicity of semiconductor wafers by processing a single crystal, the central longitudinal axis of which has an orientation that deviates from a sought orientation of the crystal lattice of the semiconductor wafers.

BACKGROUND

Monocrystalline semiconductor wafers are usually cut from single crystals obtained by semiconductor material melted inductively or in a crucible gradually being crystallized on a rotating seed crystal. A virtually round ingot having a central longitudinal axis as a geometrical axis arises in the process. Afterward, the ingot is reworked to form one or more cylindrical blocks and semiconductor wafers having a specific crystal orientation are sliced from these blocks. The reworking generally comprises slicing the block from the single crystal along cutting planes perpendicular to the central longitudinal axis of the single crystal and cylindrically grinding the block around the central longitudinal axis to form a block having the form of a cylinder.

Wire saws are usually used for slicing the semiconductor wafers. Inner-diameter saws are also suitable, in principle, although their throughput is lower. Wire saws have a wire web formed by wires lying parallel. In the course of the sawing operation, the wires penetrate through the block, as a result of which a number of semiconductor wafers corresponding to the number of gaps between the wires penetrating through the block arise simultaneously. In order to optimize the throughput, the wire web available should be utilized as completely as possible. Therefore, it is often the case that two or more blocks are arranged one behind another and sawn simultaneously.

The customer for the semiconductor wafers demands a specific orientation of the crystal lattice. The normal to the surface of the front side of the semiconductor wafer is intended to lie parallel to a vector representing the specific orientation of the crystal lattice, this being referred to hereinafter as the sought orientation of the crystal lattice.

If the central longitudinal axis of the block represents the sought orientation of the crystal lattice, semiconductor wafers having the sought orientation of the crystal lattice arise if, in the process of slicing the semiconductor wafers, the cutting planes through the block are placed perpendicularly to the central longitudinal axis of the block.

There are reasons, however, on account of which single crystals are produced with a misorientation. A misorientation of the single crystal is present if the central longitudinal axis of the single crystal does not represent the sought orientation of the crystal lattice of the semiconductor wafers, but rather forms an angle θ with a crystallographic axis representing this orientation. That can happen unintentionally, for example if the seed crystal is already misoriented or the misorientation arises during the process of pulling the single crystal, or intentionally, for example if the misorientation is brought about in order that dislocations can be better eliminated, which is often performed in practice in order to produce (110)-oriented semiconductor wafers composed of silicon.

In accordance with the method described in JP2000323443 A2, firstly a block is sliced from the single crystal, the cutting planes being placed perpendicularly to the central longitudinal axis of the single crystal. This is followed by grinding the circumferential surface of the block around the crystallographic axis representing the sought orientation of the crystal lattice of the semiconductor wafers. The ground block has the form of an oblique cylinder, the end surfaces of which do not lie perpendicular to said crystallographic axis. The advantage of this method is that correctly oriented round semiconductor wafers arise if the cutting planes during the process of slicing the semiconductor wafers from the block are oriented perpendicularly to the axis representing the sought orientation of the crystal lattice of the semiconductor wafers. One disadvantage of this procedure is that products having a wedge-shaped cross section arise at the end sides of the block, which products, as waste, lower the yield of the method.

In accordance with the method described in EP 1 498 516 A1, firstly a block is sliced from the single crystal, the cutting planes being placed perpendicular to the central longitudinal axis of the single crystal. This is followed by grinding the block around the central longitudinal axis, said block acquiring the form of a cylinder. The end surfaces of the ground block lie perpendicular to the central longitudinal axis thereof. During the process of slicing the semiconductor wafers, the ground block is oriented such that the cutting planes lie perpendicular to the crystallographic axis representing the sought orientation of the crystal lattice of the semiconductor wafers. One disadvantage of this method is that products having a wedge-shaped cross section arise at the end sides of the block, which products, as waste, lower the yield of the method. A further disadvantage is that the orientation of the block has to be effected in the wire saw. The cutting of a plurality of short blocks in one cut is not possible, and the orientation of the block in the wire saw is complicated and susceptible to faults. What is also disadvantageous is that the sliced semiconductor wafers are not round, but rather have an oval form, owing to the position of the cutting planes.

SUMMARY

An aspect of the present invention is to provide a method which does not have the disadvantages mentioned above.

In an embodiment, the present invention provides a method for producing a plurality of semiconductor wafers by processing a single crystal provided in a grown state and having a central longitudinal axis with an orientation that deviates from a sought orientation of a crystal lattice of the semiconductor wafers. At least one block is sliced from the single crystal along cutting planes perpendicular to a crystallographic axis corresponding to the sought orientation of the crystal lattice of the semiconductor wafers. A lateral surface of the block is ground around the crystallographic axis. A plurality of semiconductor wafers are then sliced from the ground block along cutting planes perpendicular to the crystallographic axis.

BRIEF DESCRIPTION OF THE DRAWINGS

An embodiment of the present invention is described in greater detail below on the basis of an example with reference to drawings, in which:

FIG. 5 shows the block in accordance with FIG. 3 after the lateral surface has been ground around the crystallographic axis;

FIG. 7 shows the block in accordance with FIG. 6 after the lateral surface thereof has been ground around the crystallographic axis;

FIG. 9 shows the relative position of the crystallographic axis and of cutting planes when slicing semiconductor wafers from a ground block in accordance with FIG. 5; and FIG. 10 shows the relative position of the crystallographic axis and of cutting planes when slicing semiconductor wafers from the ground block in accordance with FIG. 7.

DETAILED DESCRIPTION

Figure 1:
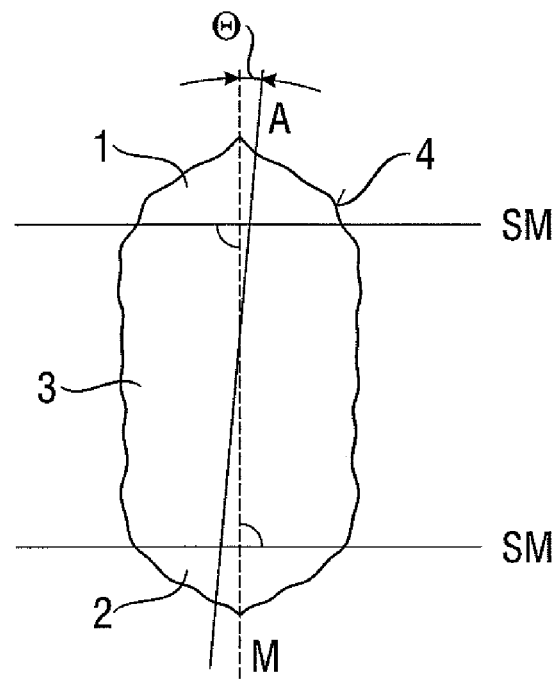
FIG. 1 shows a single crystal ("ingot") present in a grown state before processing thereof.

The present invention is concerned with the production of semiconductor wafers having a sought orientation of the crystal lattice by processing misoriented single crystals.

Upon application of a method according to an embodiment of the invention, the ground block can be cut into semiconductor wafers having the sought orientation of the crystal lattice without losses of yield arising owing to products having a wedge-shaped cross section. Furthermore, two or more blocks that are arranged one behind another with a short spacing or in a manner touching one another can be simultaneously separated into semiconductor wafers with almost complete utilization of the wire web available. The economic advantage associated therewith is particularly high if comparatively short blocks having a comparatively large diameter have to be cut into semiconductor wafers. It is preferred, therefore, to apply the method in order to produce semiconductor wafers composed of silicon having a nominal diameter of 300 mm or 450 mm, in which case, preferably, two or more ground blocks are arranged one behind another in order that the semiconductor wafers are simultaneously sliced from the blocks.

The starting product of the method is a single crystal present in the grown state ("as-grown") and having a misorientation in the sense defined in the introduction, preferably a corresponding single crystal composed of silicon. The misorientation, expressed by the angle θ between the central longitudinal axis and the crystallographic axis representing the sought orientation of the crystal lattice of the semiconductor wafers, is preferably more than 0° and not more than 2°, particularly preferably not more than 1°.

The end product of the method is semiconductor wafers having the sought orientation of the crystal lattice. The sought orientation of the crystal lattice is as desired. It can be represented, for example, by a <100>- or a <110>- or a <111>-oriented axis or by an axis whose orientation deviates from such an axis by an angle α and whose projection onto the surface of the semiconductor wafer forms an angle β with a reference direction in the plane of the surface. Representatives of the last-mentioned type of semiconductor wafers are semiconductor wafers composed of silicon having a surface which deviates slightly from the (110)-orientation. DE 10 2008 026 784 A1 describes a method which comprises the production of such semiconductor wafers.

At the beginning of the method, at least one block is sliced from the single crystal. In the course of this, a first and a second conical section are also removed from the beginning and respectively from the end of the single crystal. The preferred separating tool is a band saw. The cutting planes are chosen such that they lie perpendicular to the crystallographic axis representing the sought orientation of the crystal lattice of the semiconductor wafers. The resulting block has approximately the form of an oblique cylinder owing to the misorientation of the single crystal. It is preferred for two or more of such blocks to be sliced from the single crystal along cutting planes which lie parallel.

The position of the crystallographic axis representing the sought orientation of the crystal lattice of the semiconductor wafers relative to the central longitudinal axis of the single crystal can be determined by means of X-ray diffraction, for example. A method which manages without the use of X-ray radiation is preferred, however. Such a method is described in DE 195 26 711 A1 for example. It uses surfaces visible on the single crystal and having a known orientation as reference planes. Such surfaces are the (111) surfaces for example, which are visible in the case of single crystals composed of silicon having a <100> orientation or an orientation slightly deviating therefrom in the shoulder region of the first conical section of the single crystal. The position of the crystallographic axis representing the sought orientation of the crystal lattice of the semiconductor wafers is determined optically with the aid of the surfaces having a known orientation as reference planes. Expediently, a laser beam is directed onto the surfaces and the reflected beam, by means of suitably arranged mirrors, is evaluated in order to determine the position of the crystallographic axis.

The information thus obtained is then used to orient the single crystal such that, during the process of slicing the at least one block, the cuts formed by the band saw are effected in cutting planes lying perpendicular to the crystallographic axis determined.

In accordance with one preferred embodiment of the method, the information thus obtained can furthermore be used for orienting the single crystal in the manner described, and for marking a reference direction in the plane of the subsequent surface of the semiconductor wafer. That can be done, for example, by grinding a notch that marks the reference direction into the circumferential surface of the single crystal, or by fitting markings in order to be able to grind such a notch at a later point in time.

The lateral surface of the block sliced from the single crystal is subsequently ground around the crystallographic axis determined, such that said block acquires the form of a cylinder. The crystallographic axis representing the sought orientation of the crystal lattice of the semiconductor wafers lies parallel to the central longitudinal axis of the cylinder. The diameter of the cylinder is preferably somewhat larger than the nominal diameter of the semiconductor wafers to be produced, in order that the edges thereof can still be ground and polished without the nominal diameter being undershot.

After the process of grinding the lateral surface of the block, semiconductor wafers are sliced from the ground block, to be precise along cutting planes lying perpendicular to the crystallographic axis representing the sought orientation of the crystal lattice of the semiconductor wafers. The end surfaces of the ground block form reference surfaces lying parallel to the cutting planes provided. Therefore, it is comparatively simple to correctly orient the ground block for slicing the semiconductor wafers. Care merely can be taken to ensure that the separating tool, for example the wires of the wire web of a wire saw, and the end surfaces of the ground block are oriented in a parallel fashion, or that the wires lie perpendicular to the lateral surface of the cylinder.

In order to optimize the throughput, it is preferred to slice the semiconductor wafers with the aid of a wire saw and, in the process, to use as far as possible all of the wires of the wire web. If appropriate, therefore, two or more blocks are arranged one behind another with a short spacing or preferably adhesively bonded together in this arrangement, such that the wire web available is utilized as completely as possible. Furthermore or as an alternative, two or more of the blocks can also be arranged alongside one another and the semiconductor wafers can be sliced from the blocks simultaneously.

Figure 2:
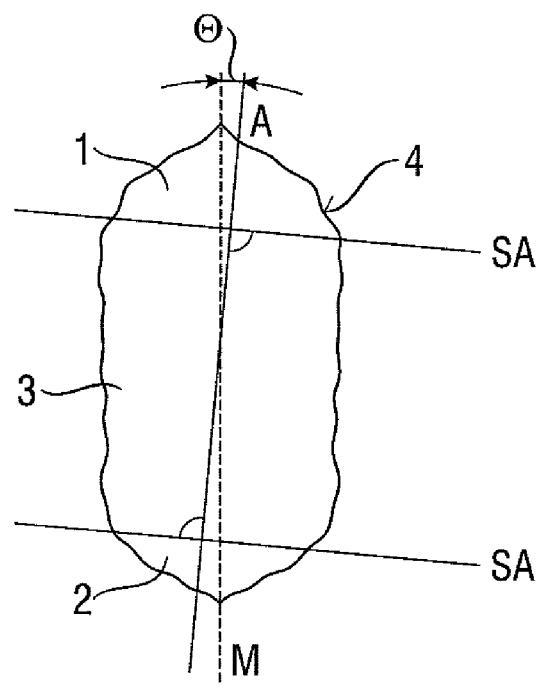
FIG. 2 shows the single crystal ("ingot") present in the grown state before processing thereof according to an embodiment of the invention.

The single crystal illustrated in FIG. 1 and FIG. 2, in the example employed a single crystal composed of silicon having a central longitudinal axis M oriented in the <100> direction, comprises in the grown state conical sections 1 and 2 at the beginning and at the end of the single crystal and a section 3 having a virtually uniform diameter between the conical sections. In the region of the shoulder, that is to say in the region of that part of the first conical section 1 which adjoins section 3, planar surfaces 4 are present, the surface normal with respect thereto facing in the <111> direction. The central longitudinal axis M has an orientation that deviates from the crystallographic axis A representing the sought orientation of the crystal lattice of the semiconductor wafers. The two axes form an angle $\theta$. The surfaces 4 are preferably used as reference surfaces with respect to which the position of the crystallographic axis A is determined by optical means. The angle between the surface normal with respect to the surfaces 4 and the <100> direction is 54.73° for example.

At least one block is sliced from the single crystal.

Carried out in a conventional manner, the block is sliced along cutting planes SM (FIG. 1) lying perpendicular to the central longitudinal axis M. The block 5 illustrated in FIG. 3 arises in the process. The central longitudinal axis M of said block has an orientation that deviates from the orientation of the crystallographic axis A representing the sought orientation of the crystal lattice of the semiconductor wafers.

Upon application of the method according to an embodiment of the invention, the block is sliced along cutting planes SA lying perpendicular to the crystallographic axis A (FIG. 2). The block 6 illustrated in FIG. 6 arises in the process.

The lateral surface of the block is ground cylindrically.

Figure 3:
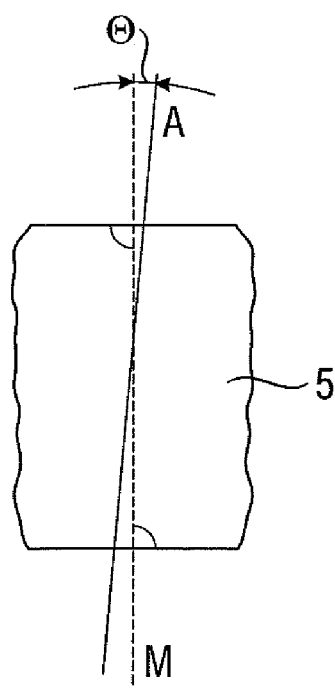
FIG. 3 shows a block sliced from the single crystal in accordance with FIG. 1.
Figure 4:
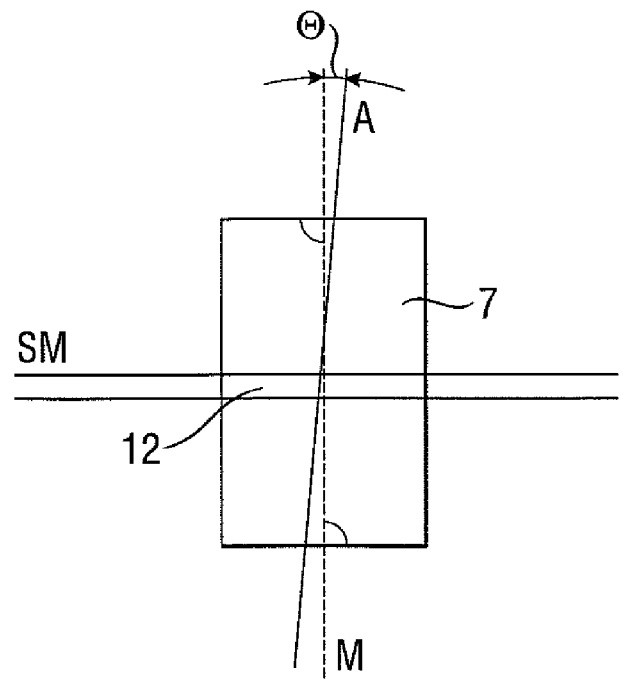
FIG. 4 shows the block in accordance with FIG. 3 after a lateral surface has been ground around the central longitudinal axis.

Carried out in a conventional manner, the lateral surface of the block 5 from FIG. 3 is ground around the central axis M or around the crystallographic axis A. In the first case, this gives rise to the ground block 7 in accordance with FIG. 4, having the form of a cylinder, or the ground block 8 in accordance with FIG. 5, having the form of an oblique cylinder.

Figure 6:
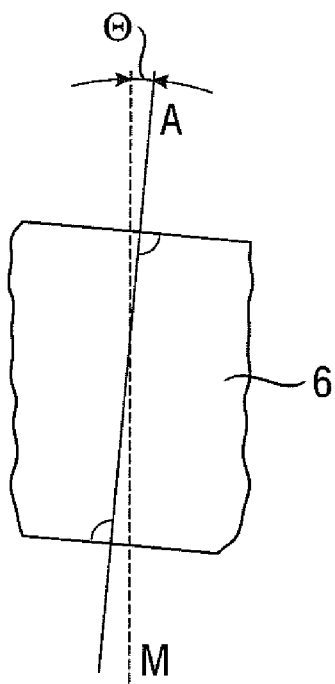
FIG. 6 shows a block sliced in accordance with FIG. 2.

Upon application of a method according to an embodiment of the invention, the lateral surface of the block 6 illustrated in FIG. 6 is ground around the crystallographic axis A, as a result of which the ground block 9 acquires the form of a cylinder as illustrated in FIG. 7. The crystallographic axis A of the ground block lies parallel to the central longitudinal axis thereof.

Figure 8:
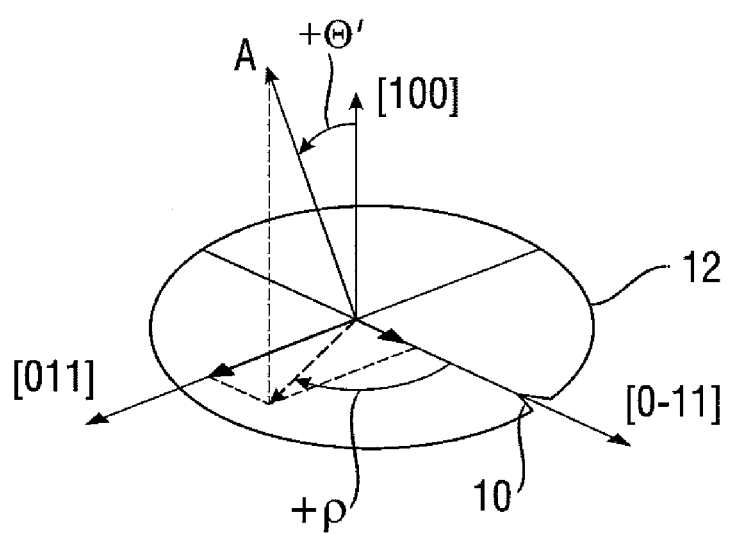
FIG. 8 shows the orientation of the crystal lattice of a semiconductor wafer sliced from the ground block in accordance with FIG. 4.

If semiconductor wafers are sliced from a ground block 7—obtained in the conventional manner described—along cutting planes SM perpendicular to the central longitudinal axis M (FIG. 4), misoriented semiconductor wafers arise, one wafer 12 of which is illustrated in FIG. 8. The surface normal facing in <100> direction and the crystallographic axis A representing the sought orientation of the crystal lattice of the semiconductor wafer form the angle $\theta'$. The [0-11] direction, marked by a notch 10, describes a reference direction lying in the plane of the surface of the semiconductor wafer. The azimuth angle $\phi$ describes the angle between the reference direction and the projection of the crystallographic axis A onto the surface of the semiconductor wafer.

Semiconductor wafers are sliced from the ground block.

If semiconductor wafers are sliced from a ground block 8 (FIG. 5) obtained in the conventional manner described and the separating cuts are performed in cutting planes SA perpendicular to the crystallographic axis A, as is shown in FIG. 9, products 11 having a wedge-shaped cross section arise at the end sides of the block, which products cannot be used as semiconductor wafers.

Upon application of the method according to an embodiment of the invention, the ground block 9 illustrated in FIG. 7 is divided into semiconductor wafers. The semiconductor wafers, in accordance with the illustration in FIG. 10, are sliced from the ground block 9 along cutting planes SA perpendicular to the crystallographic axis A. No waste in the form of products having a wedge-shaped cross section arises in this case. The normal to the surface of the resulting semiconductor wafers faces in the direction of the crystallographic axis A, and the semiconductor wafers therefore have the sought orientation of the crystal lattice.

While the invention has been particularly shown and described with reference to preferred embodiments thereof, it will be understood by those skilled in the art that various changes in form and details may be made therein without departing from the spirit and scope of the invention.

What is claimed is:

1. A method for producing a plurality of semiconductor wafers by processing a single crystal, the method comprising:
   providing a single crystal in an as-grown state, the single crystal having a central longitudinal axis with an orientation that deviates from a sought orientation of a crystal lattice of the semiconductor wafers;
   slicing at least one block from the single crystal along cutting planes perpendicular to a crystallographic axis corresponding to the sought orientation of the crystal lattice of the semiconductor wafers;
   grinding a lateral surface of the at least one block around the crystallographic axis so as to form at least one ground block with a central longitudinal axis substantially parallel to the crystallographic axis; and
   slicing a plurality of semiconductor wafers from at least one ground block along cutting planes perpendicular to the crystallographic axis.

2. The method recited in claim 1, further comprising determining a position of the crystallographic axis using surfaces that are visible on the single crystal and that have a known orientation as reference planes.

3. The method recited in claim 1, wherein the slicing the at least one block from the single crystal includes using a band saw.

4. The method recited in claim 1, further comprising marking the at least one block with a mark indicating a reference direction in a plane of the semiconductor wafers.

5. The method recited in claim 1, wherein the at least one ground block includes a first block and a second block,
   further comprising arranging the first block adjacent to the second block,
   and wherein the slicing the plurality of semiconductor wafers includes using a multi wire saw to slice the semiconductor wafers from the first and second block.

6. The method recited in claim 5, further comprising adhesively bonding the first block to the second block before slicing the plurality of semiconductor wafers.

7. The method recited in claim 1, wherein the slicing at least one block from the single crystal is carried out with the single crystal in the as-grown state.

\* \* \* \* \*